US010237967B2

(12) United States Patent
Maillet, Jr. et al.

(10) Patent No.: US 10,237,967 B2
(45) Date of Patent: Mar. 19, 2019

(54) COOLING ASSEMBLY FOR ELECTRONICS ASSEMBLY OF IMAGING SYSTEM

(71) Applicant: Analogic Corporation, Peabody, MA (US)

(72) Inventors: Richard A. Maillet, Jr., Saugus, MA (US); Garry Allen Fellows, Middleton, MA (US)

(73) Assignee: Analogic Corporation, Peabody, MA (US)

( * ) Notice: Subject to any disclaimer, the term of this patent is extended or adjusted under 35 U.S.C. 154(b) by 586 days.

(21) Appl. No.: 14/873,599

(22) Filed: Oct. 2, 2015

(65) Prior Publication Data
US 2017/0099725 A1 Apr. 6, 2017

(51) Int. Cl.
G01R 33/36 (2006.01)
G01R 33/38 (2006.01)
H05K 1/02 (2006.01)

(52) U.S. Cl.
CPC ......... H05K 1/021 (2013.01); G01R 33/3614 (2013.01); G01R 33/3804 (2013.01); H05K 1/0272 (2013.01); H05K 1/0206 (2013.01); H05K 2201/064 (2013.01); H05K 2201/10416 (2013.01)

(58) Field of Classification Search
CPC .... H05K 1/021; H05K 1/0272; H05K 1/0206; H05K 2201/064; H05K 2201/10416; G01R 33/3614; G01R 33/3804
See application file for complete search history.

(56) References Cited

U.S. PATENT DOCUMENTS

| 5,818,133 | A | * | 10/1998 | Kershaw | F16C 21/00 310/64 |
| 6,087,842 | A | * | 7/2000 | Parker | G01R 31/2884 324/750.3 |
| 6,650,538 | B1 | * | 11/2003 | Chu | H01L 23/467 165/121 |
| 6,807,059 | B1 | * | 10/2004 | Dale | H01L 21/4882 165/185 |
| 2004/0052027 | A1 | * | 3/2004 | Stewart | H01L 23/4006 361/118 |
| 2005/0210906 | A1 | * | 9/2005 | Laufer | F28F 3/048 62/259.2 |
| 2006/0111857 | A1 | * | 5/2006 | Shah | G01D 1/00 702/85 |
| 2007/0139881 | A1 | * | 6/2007 | Ouyang | F28F 13/16 361/689 |

(Continued)

Primary Examiner — Ruifeng Pu
(74) Attorney, Agent, or Firm — TraskBritt (57) ABSTRACT

Among other things, an electronics assembly within an imaging system is provided. The electronics assembly includes a circuit board assembly through which a signal is delivered. The circuit board assembly defines a heat transfer opening between a first side and a second side. An electronics component is electrically coupled to the first side of the circuit board assembly. A heat transfer component supports the electronics component. The heat transfer component includes a base portion coupled to the electronics component and to the circuit board assembly. The heat transfer component includes a heat dissipation portion extending through the heat transfer opening of the circuit board assembly. The heat dissipation portion dissipates heat generated by the electronics component.

19 Claims, 5 Drawing Sheets (56) References Cited

U.S. PATENT DOCUMENTS

| | | | |
|---|---|---|---|
| 2007/0268673 A1* | 11/2007 | Ankireddi | H01L 23/3677 361/710 |
| 2008/0150125 A1* | 6/2008 | Braunisch | H01L 25/0657 257/712 |
| 2008/0180914 A1* | 7/2008 | Khanna | H01L 23/473 361/704 |
| 2008/0223567 A1* | 9/2008 | Liang | H01L 23/3677 165/185 |
| 2009/0086171 A1* | 4/2009 | Sun | G03B 21/16 353/52 |
| 2009/0236075 A1* | 9/2009 | Li | H01L 23/4093 165/80.2 |
| 2009/0268403 A1* | 10/2009 | Chen | G06F 1/203 361/692 |
| 2010/0177519 A1* | 7/2010 | Schlitz | F04B 17/00 362/294 |
| 2013/0068433 A1* | 3/2013 | Muthigi | F28F 1/02 165/170 |
| 2013/0091693 A1* | 4/2013 | Campbell | H05K 7/20 29/592.1 |
| 2013/0126590 A1* | 5/2013 | Privitera | H05K 3/3431 228/170 |
| 2013/0198914 A1* | 8/2013 | Smith | G01Q 60/52 850/47 |
| 2013/0256003 A1* | 10/2013 | Duppong | H05K 1/0204 174/252 |
| 2015/0118391 A1* | 4/2015 | Kilhenny | F21V 29/004 427/97.2 |
| 2015/0123663 A1* | 5/2015 | Brusila | H01L 23/473 324/322 |
| 2015/0217111 A1* | 8/2015 | Stevenson | A61N 1/08 607/63 |
| 2016/0135283 A1* | 5/2016 | Chauvin | H05K 7/20163 361/697 |
| 2016/0146545 A1* | 5/2016 | Engelhardt | F28D 15/04 165/76 |
| 2016/0282153 A1* | 9/2016 | Hefetz | G01D 11/245 |
| 2018/0007779 A1* | 1/2018 | Muller | H05K 1/0203 |

\* cited by examiner

COOLING ASSEMBLY FOR ELECTRONICS ASSEMBLY OF IMAGING SYSTEM

BACKGROUND

The present application relates to cooling an electronics assembly within a system. It finds particular application in the field of security and/or medical imaging, where computed tomography (CT) systems, line-scan systems, digital projection systems, mammography systems, other ionizing radiation (e.g., x-ray or gamma ray) systems, ultrasound systems, magnetic resonance imaging (MRI), etc. may be used to image an object or a patient. It also relates to other applications, such as particle therapy systems, computer systems, etc. where the heat generated by processors, power systems, etc. thereof have an effect on the performance of the system.

Electronic components, such as those used in the aforementioned systems, can generate unwanted heat. Conventionally, a number of techniques have been used to dissipate this unwanted heat so as to limit damage to the components of the system. One such technique involves a cold plate that circulates a coolant. The design of the cold plate includes a relatively large substrate with aluminum or copper pipes machined into the substrate. While these cold plates are effective for dissipating heat from the electronic components, they are often difficult to produce, expensive, and require frequent maintenance.

BRIEF SUMMARY

Aspects of the present application address the above matters, and others. According to one aspect, an electronics assembly within an imaging system is provided. The electronics assembly comprises a circuit board assembly through which a signal is configured to be delivered. The circuit board assembly defines a heat transfer opening between a first side and a second side. The electronics assembly comprises an electronics component electrically coupled to the first side of the circuit board assembly. The electronics assembly comprises a heat transfer component supporting the electronics component. The heat transfer component comprises a base portion coupled to the electronics component and to the circuit board assembly. The heat transfer component comprises a heat dissipation portion extending through the heat transfer opening of the circuit board assembly. The heat dissipation portion is configured to dissipate heat generated by the electronics component.

According to another aspect, an electronics assembly within an imaging system is provided. The electronics assembly comprises a circuit board assembly through which a signal is configured to be delivered. The circuit board assembly defines a heat transfer opening between a first side and a second side. The electronics assembly comprises an electronics component electrically coupled to the first side of the circuit board assembly. The electronics assembly comprises a heat transfer component supporting the electronics component. The heat transfer component comprises a base portion coupled to the electronics component and to the circuit board assembly. The heat transfer component comprises a heat dissipation portion extending through the heat transfer opening of the circuit board assembly. A cooling sub-assembly is coupled to the second side of the circuit board assembly. The cooling sub-assembly defines a cooling channel extending adjacent to the heat transfer opening of the circuit board assembly such that the heat dissipation portion extends into the cooling channel. A cooling fluid is configured to flow through the cooling channel in contact with the heat dissipation portion of the heat transfer component. The heat dissipation portion of the heat transfer component and the cooling fluid are configured to dissipate heat generated by the electronics component.

According to another aspect, a magnetic resonance imaging (MRI) system comprises a housing defining an examination region and a coil supported within the housing and configured to generate a magnetic field within the examination region. The MRI system comprises a power electronics assembly for delivering power to the coil. The power electronics assembly comprises a circuit board assembly through which power is configured to be delivered. The circuit board assembly defines a heat transfer opening between a first side and a second side. The power electronics assembly comprises an electronics component electrically coupled to the first side of the circuit board assembly. The power electronics assembly comprises a heat transfer component supporting the electronics component. The heat transfer component comprises a base portion coupled to the electronics component and to the circuit board assembly. The heat transfer component comprises a heat dissipation portion extending through the heat transfer opening of the circuit board assembly. The heat transfer component comprises a cooling sub-assembly coupled to the second side of the circuit board assembly. The cooling sub-assembly defines a cooling channel extending adjacent to the heat transfer opening of the circuit board assembly such that the heat dissipation portion extends into the cooling channel. A cooling fluid is configured to flow through the cooling channel in contact with the heat dissipation portion of the heat transfer component. The heat dissipation portion of the heat transfer component and the cooling fluid are configured to dissipate heat generated by the electronics component.

BRIEF DESCRIPTION OF THE DRAWINGS

The application is illustrated by way of example and not limitation in the figures of the accompanying drawings, in which like references generally indicate similar elements and in which.

DETAILS DESCRIPTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It may be evident, however, that the claimed subject matter may be practiced without these specific details. In other instances, structures and devices are illustrated in block diagram form in order to facilitate describing the claimed subject matter.

The present disclosure relates to a cooling sub-assembly for dissipating unwanted heat that is generated by an electronics assembly of an imaging system, such as a magnetic resonance imaging (MRI) system, computed tomography (CT) system, line-scan system, digital projection system, mammography system, other ionizing radiation (e.g., x-ray or gamma ray) system, and/or ultrasound system, for example. An electronics component may be electrically coupled to a first side of the circuit board assembly, wherein the electronics component generates heat. A heat transfer component can support the electronics component. A heat dissipation portion of the heat transfer component can extend at least partially through a heat transfer opening in the circuit board assembly. Heat can be dissipated from the electronics component to the heat transfer component, and through heat transfer opening.

A cooling sub-assembly can be coupled to a second side of the circuit board assembly. The cooling sub-assembly defines a cooling channel through which a cooling fluid is configured to flow. The cooling channel can extend adjacent to the heat transfer opening. As such, the heat dissipation portion of the heat transfer component can extend at least partially into the cooling channel. In this way, when the cooling fluid flows through the cooling channel, the cooling fluid can contact the heat dissipation portion, thus dissipating heat from the heat dissipation portion. Together, the heat transfer component and the cooling sub-assembly can draw heat, generated by the electronics component, from the electronics component and to the cooling fluid. This heat dissipation can reduce the likelihood of damage to components within the imaging system, for example.

It may be appreciated that while the present disclosure describes the cooling-subassembly as having particular applicability to imaging systems, such a cooling system may also have applicability to other systems where heat generated by electronic circuitry thereof is dissipated through a cooling system.

Figure 1:
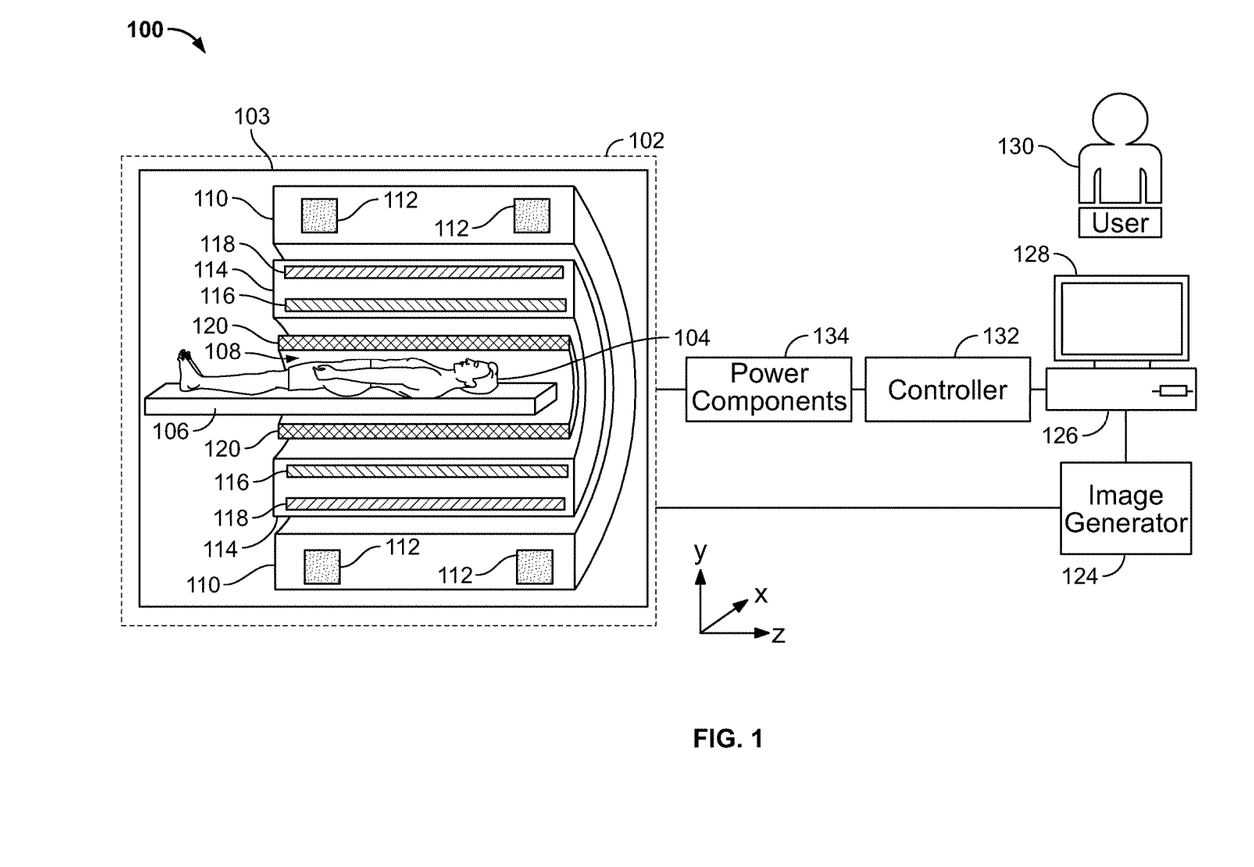
FIG. 1 illustrates an example environment of a magnetic resonance imaging modality.

FIG. 1 illustrates an example environment 100 of an imaging system (e.g., a magnetic resonance imaging system 102) in which the cooling sub-assembly finds applicability. In the example environment 100, the MRI system 102 comprises a housing 103 that is configured to examine an object 104, such as a human, an animal, a container, etc. For ease of understanding, a perspective view of a cross-sectional slice of the housing, including at least some of the components comprised therein, is illustrated in the example environment 100.

During an examination of the object 104, the object 104 can be supported on a support article 106, such as a bed, a conveyor belt, a platform, or the like. The housing 103 defines an examination region 108, which may comprise an opening, a bore, etc. The support article 106 can be selectively positioned in the examination region 108 within the MRI system 102. For example, the support article 106, while supporting the object 104, can be moved into and out of the examination region 108.

The MRI system 102 comprises a static magnetic field magnet 110 supported within the housing 103. The static magnetic field magnet 110 comprises one or more magnetic coils 112 that extend circumferentially around the examination region 108 (e.g., into and out of the page in FIG. 1). In some examples, the coils 112 may comprise superconducting coils that are immersed in a cooling liquid within a container. The coils 112 can generate a static magnetic field within the examination region 108. The static magnetic field can directionally align magnetic dipole moments of nuclei (e.g., hydrogen, phosphorous, sodium, etc.) that cause magnetic resonance within the object 104.

The MRI system 102 comprises a gradient magnetic field magnet 114 supported within the housing 103. The gradient magnetic field magnet 114 comprises one or more magnetic coils, such as a main coil 116 and a shield coil 118, that extend circumferentially around the examination region 108 (e.g., into and out of the page in FIG. 1). In an example, the gradient magnetic field magnet 114 is positioned radially within the static magnetic field magnet 110, such that the static magnetic field magnet 110 circumferentially surrounds the gradient magnetic field magnet 114. The main coil 116 can generate gradient magnetic fields extending along an x-axis, a y-axis, and/or a z-axis. The main coil 116 may generate a spatially-linear gradient magnetic field to acquire an MR image. In an example, the shield coil 118 is positioned radially outwardly from the main coil 116. The shield coil 118 can generate a shielding magnetic field on an outer radial side of the main coil 116. This shielding magnetic field can shield the static magnetic field magnet 110 from the gradient magnetic field that is generated by the main coil 116, for example.

The MRI system 102 comprises a radio frequency (RF) coil 120 supported within the housing 103. The RF coil 120 extends circumferentially around the examination region 108 (e.g., into and out of the page in FIG. 1). In an example, the RF coil 120 is positioned radially within the gradient magnetic field magnet 114, such that the gradient magnetic field magnet 114 circumferentially surrounds the RF coil 120. The RF coil 120 can generate an RF magnetic field within the examination region 108. The object 104, in response to being subjected to the RF magnetic field, can generate an echo magnetic resonance (MR) signal that is received by the RF coil 120. For example, to excite a nucleus within the object 104 from a low-energy state to a high-energy state, the RF coil 120 can generate and apply an RF magnetic field having a certain frequency corresponding to a certain type of nucleus. When the RF magnetic field generated by the RF coil 120 is applied to the nucleus, the nucleus may transition from a low-energy state to a high-energy state, and in response, the nucleus may radiate the echo MR signal. The RF coil 120 can receive this echo MR signal. In some examples, an RF shield may be positioned radially outwardly from the RF coil 120 to shield the gradient magnetic field magnet 114 from the RF magnetic field generated by the RF coil 120. It may be appreciated that while reference is made herein to a single RF coil 120 configured to both generate the RF magnetic field and receive the echo MR signal, in other embodiments, the MRI system may comprise two or more RF coils, where a first set of one or more RF coils generate the RF magnetic field and a second set of one or more RF coils receive (e.g., listen for) the echo MR signal.

The echo MR signal can be digitized and transmitted to an image generator 124, which can generate image data from the echo MR signal using a suitable analytical, iterative, and/or other image generation techniques. The MRI environment 100 may also comprise a terminal 126, or workstation (e.g., a computer), configured to receive the image(s) from the image generator 124. These images can be displayed on a monitor 128 to a user 130 (e.g., doctor, nurse, medical technician, etc.). In this way, the user 130 can inspect the image(s) to identify areas of interest within the object 104. The terminal 126 can also be configured to receive user input which can direct operations of the MRI system 102.

In the example MRI environment 100, a controller 132 is operably coupled to the terminal 126. The controller 132 may be configured to control operations of the MRI system 102, for example. By way of example, in some embodiments, the controller 132 may be configured to receive information from the terminal 126 and issue instructions to the MRI system 102 indicative of the received information. In a possible example, the controller 132 is configured to issue control instructions to the static magnetic field magnet 110, the gradient magnetic field magnet 114, and the RF coil 120 to control the electromagnetic fields generated thereby. In the illustrated example, the controller 132 may be operably coupled to power components 134 that control or adjust the amount of power and/or control characteristics thereof (e.g., amperes, voltage, etc.) delivered to the MRI system 102. For example, the power components 134 may comprise rectifiers, inverters, DC to DC converters, AC to AC converters, transformers, etc. that control power delivery to the MRI system 102 (e.g., thereby controlling the magnetic fields generated by the coils 112, the main coil 116, the shield coil 118, the RF coil 120).

Figure 2:
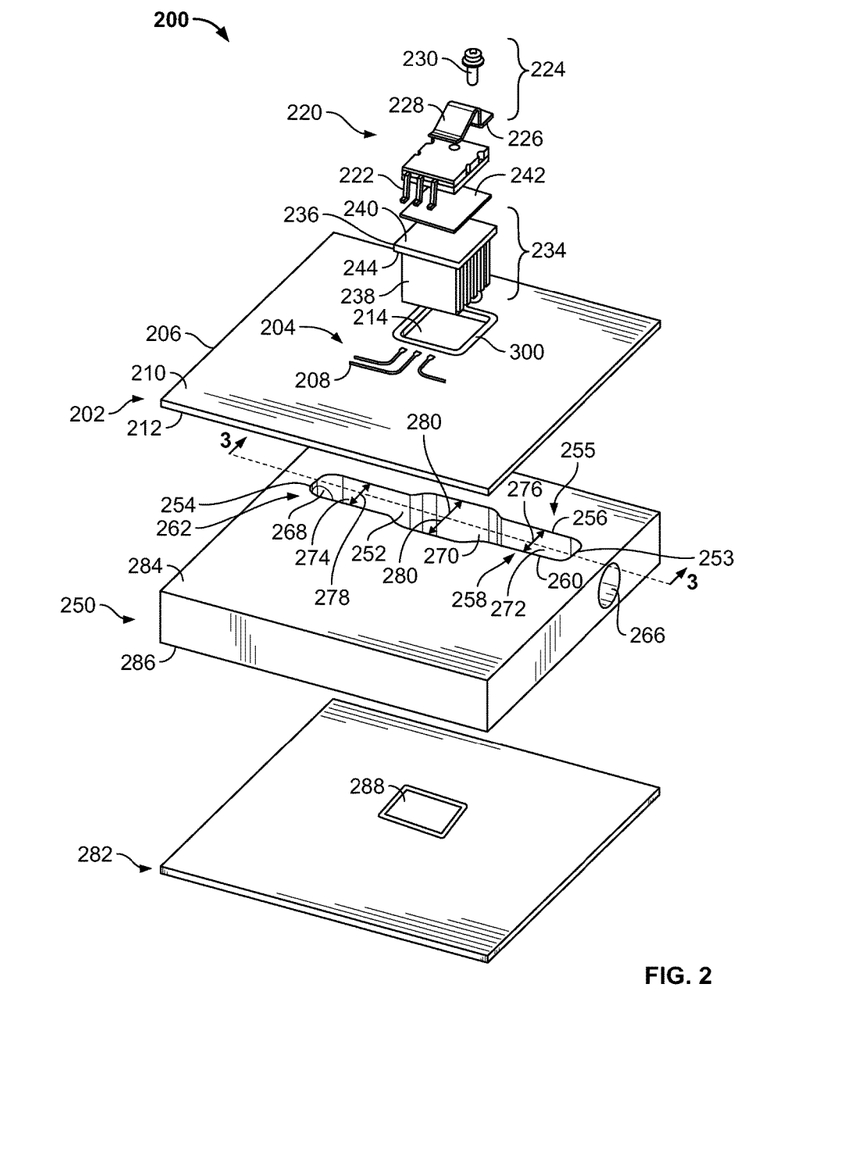
FIG. 2 illustrates an example electronics assembly.

Turning to FIG. 2, a partially exploded example of an electronics assembly 200 for delivering a signal (e.g., power, data, etc.) within the MRI system 102 is illustrated. In a possible example, the electronics assembly 200 can be provided for delivering the signal (e.g., power, data, etc.) to a coil of the MRI system 102, such as one or more of the coils 112, the main coil 116, the shield coil 118, the RF coil 120, etc. The electronics assembly 200 may comprise, for example, a power electronics assembly.

The electronics assembly 200 comprises a circuit board assembly 202 through which the signal may be delivered. The circuit board assembly 202 comprises a conductive portion 204 and a dielectric portion 206. In an example, the conductive portion 204 comprises an electrically conductive material through which electric current is capable of being transmitted, such as copper, aluminum, etc. In some examples, the conductive portion 204 may comprise conductive traces 208, conductive tracks, conductive ink, conductive pads, etc. that are attached to (e.g., mounted to, etc.), formed upon, etc. the dielectric portion 206. In the illustrated example, the conductive traces 208 are disposed on a first side 210 of the dielectric portion 206.

The dielectric portion 206 can define the first side 210, on which the conductive portion 204 is formed, and a second side 212. In an example, the dielectric portion 206 comprises any number of materials that are electrically insulating and are resistant to the flow of electric current through the dielectric portion 206. In some examples, the dielectric portion 206 comprises a substrate onto which the conductive portion 204 is applied. The dielectric portion 206 can comprise, for example, one or more of fiberglass, silicon, silicon dioxide, aluminum oxide, sapphire, germanium, gallium arsenide, etc.

A heat transfer opening 214 is defined between the first side 210 and the second side 212 of the circuit board assembly 202. In an example, the heat transfer opening 214 has a substantially quadrilateral shape, though other shapes are envisioned (e.g., circular shapes, oval shapes, triangular shapes, etc.). The heat transfer opening 214 can be bounded by walls of the dielectric portion 206 of the circuit board assembly 202.

The electronics assembly 200 comprises an electronics component 220. The electronics component 220 can comprise, for example, one or more transistors, amplifiers, integrated circuits, etc. The electronics component 220 can be electrically coupled to the first side 210 of the circuit board assembly 202. For example, the electronics component 220 comprises one or more conductive portions 222 that can be electrically coupled to the conductive traces 208 of the circuit board assembly 202. The electrical coupling between the conductive portions 222 of the electronics component 220 and the conductive traces 208 may comprise soldering, for example. In this example, electric current can be transmitted between the electronics component 220 and the circuit board assembly 202.

The electronics assembly 200 comprises an attachment structure 224 for attaching the electronics component 220 with respect to the circuit board assembly 202. In an example, the attachment structure 224 comprises a first attachment portion 226 and a second attachment portion 228. The first attachment portion 226 can be substantially planar and can extend along a plane that is substantially parallel to the first side 210 of the circuit board assembly 202. The first attachment portion 226 can define an opening through which a fastener 230 is configured to be received. The fastener 230 can pass through the opening in the first attachment portion 226 and through an opening in the circuit board assembly 202. As such, the fastener 230 can function to attach the attachment structure 224 to the circuit board assembly 202. In some examples, the fastener 230 and the opening in the circuit board assembly 202 may be threaded, so as to allow for a threading attachment of the fastener 230 to the circuit board assembly 202.

The first attachment portion 226 can be attached to the second attachment portion 228 of the attachment structure 224. In an example, the second attachment portion 228 may be spaced a distance apart from the first side 210 of the circuit board assembly 202. The electronics component 220 can be positioned in contact with the second attachment portion 228, such that the electronics component 220 is positioned between the circuit board assembly 202 and the second attachment portion 228. The second attachment portion 228 can flex with respect to the first attachment portion 226, such that the second attachment portion 228 can provide a biasing force onto the electronics component 220. In this example, the second attachment portion 228 can provide a biasing force onto the electronics component 220 towards the circuit board assembly 202, so as to hold the electronics component 220 in a relatively fixed and non-movable position with respect to the circuit board assembly 202.

In this way, the electronics component 220 can be attached to the circuit board assembly 202 in two ways: (1) through the electrical coupling between the conductive portions 222 of the electronics component 220 and the conductive traces 208 of the circuit board assembly 202; and (2) through the second attachment portion 228 contacting, holding and biasing the electronics component 220 towards the circuit board assembly 202. The electronics component 220 can be selectively removed and/or replaced, such as by loosening and/or removing the fastener 230 from the circuit board assembly 202 and detaching the conductive portions 222 from the conductive traces 208.

The electronics assembly 200 comprises a heat transfer component 234. The heat transfer component 234 can be arranged to at least partially extend through the heat transfer opening 214. The heat transfer component 234 can support the electronics component 220 and dissipate heat generated by the electronics component 220. For example, during operation and delivery of a signal (e.g., power, data, etc.) within the MRI system 102, the electronics component 220 may generate unwanted heat. The heat transfer component 234 can assist in dissipating this heat from the electronics component 220.

In an example, the heat transfer component 234 comprises a base portion 236 and a heat dissipation portion 238. The base portion 236 and/or the heat dissipation portion 238 may comprise a material with a relatively high thermal conductivity, such as copper, silver, etc.

The base portion 236 can be sealed with respect to the circuit board assembly 202. In a possible example, a sealing device, such as a sealant, a gasket, an O-ring, etc. can be positioned between and/or in contact with the base portion 236 of the heat transfer component 234 and the circuit board assembly 202. In such an example, the sealing device can substantially limit a passage of liquid through the heat transfer opening 214 from the second side 212 to the first side 210 of the circuit board assembly 202. In the illustrated example, the electronics assembly 200 is not limited to comprising a sealing device, and, instead, the base portion 236 can be coupled to the circuit board assembly 202, such as by soldering the base portion 236 to the heat dissipation portion 238, for example. For example, as will be described below, a conductive surface 300 can extend circumferentially around the heat transfer opening 214, allowing for the base portion 236 to be coupled to the conductive surface 300 (e.g., such as through a solder bond or other fluid-tight bond).

In an example, the base portion 236 of the heat transfer component 234 is substantially planar and can support and/or be coupled to the electronics component 220. For example, the electronics component 220 can be positioned adjacent to a first side 240 of the base portion 236. In an example, the electronics component 220 may be in contact with the first side 240 of the base portion 236. In the illustrated example, an intermediary structure, such as a thermal interface 242, may be positioned between the electronics component 220 and the first side 240 of the base portion 236. The thermal interface 242 may comprise a material with a relatively high thermal conductivity, such as copper, silver, etc. As such, heat generated by the electronics component 220 can be transmitted through the thermal interface 242 to the base portion 236 of the heat transfer component 234.

The heat dissipation portion 238 of the heat transfer component 234 can be attached to a second side 244 of the base portion 236. In an example, the heat dissipation portion 238 can extend from the second side 244 of the base portion 236 and at least partially through the heat transfer opening 214 of the circuit board assembly 202. The heat dissipation portion 238 can dissipate heat that is generated by the electronics component 220. As will be described below, the heat dissipation portion 238 comprises any number of configurations and structures, such as fins, pins, etc.

The electronics assembly 200 comprises a cooling sub-assembly 250. The cooling sub-assembly 250 may be positioned adjacent to and/or coupled to the second side 212 of the circuit board assembly 202. The cooling sub-assembly 250 can comprise a non-conductive material, such as fiberglass or the like.

The cooling sub-assembly 250 defines a cooling channel 252 through which a cooling fluid is configured to flow. The cooling channel 252 can extend at least partially through the cooling sub-assembly 250, such as between opposing sides (e.g., an upper side and a lower side) of the cooling sub-assembly 250. In the illustrated example, the cooling channel 252 can extend adjacent to the heat transfer opening 214 of the circuit board assembly 202. In this example, the cooling channel 252 extends between a first cooling end 253 and a second cooling end 254.

The cooling channel 252 is bounded on a first side 255 by a first wall 256 of the cooling sub-assembly 250 and on a second side 258 by a second wall 260 of the cooling sub-assembly 250. It will be appreciated that the cooling channel 252 is not limited to the illustrated size and/or shape, and in other examples, the cooling channel 252 can have a larger or smaller length, width, and/or depth. The different sizes and/or shapes of the cooling channel 252 may, in an example, depend upon the amount of cooling fluid needed, the amount of heat to be dissipated, etc.

In this example, some portions of the first wall 256 and the second wall 260 extend substantially parallel to each other while other portions of the first wall 256 extend non-parallel to each other. In the illustrated example, the first wall 256 can extend along a non-linear axis between the first cooling end 253 and the second cooling end 254 of the cooling channel 252. Likewise, the second wall 260 can extend along a non-linear axis between the first cooling end 253 and the second cooling end 254 of the cooling channel 252.

The cooling channel 252 may be bounded along a third side 262 (e.g., an upper side) that is defined between the first wall 256 and the second wall 260 of the cooling sub-assembly 250 by the circuit board assembly 202. In the illustrated example, the third side 262 may be adjacent to the second side 212 of the circuit board assembly 202. The cooling channel 252 may therefore be bounded on the third side 262 by the second side 212 of the circuit board assembly 202. As such, in this example, the cooling channel 252 may be in fluid communication with the second side 212 of the circuit board assembly 202.

The cooling sub-assembly 250 can define a first opening 266 and a second opening 268 within opposing walls. In this example, the cooling channel 252 can extend between the first opening 266 and the second opening 268. The first opening 266 may be positioned adjacent to the first cooling end 253 of the cooling channel 252 while the second opening 268 may be positioned adjacent to the second cooling end 254 of the cooling channel 252. As such, the first opening 266 and the second opening 268 may be in fluid communication with the cooling channel 252. In one possible example, cooling fluid can flow through the cooling sub-assembly 250 from the first cooling end 253 to the second cooling end 254. That is, the cooling fluid can enter the cooling sub-assembly 250 by passing through the first opening 266. The cooling fluid can then flow from the first opening 266, through the cooling channel 252, and exit out of the second opening 268.

In the illustrated example, a component opening 270 is defined between the first wall 256 and the second wall 260 of the cooling sub-assembly 250. The component opening 270 may be sized to at least partially receive the heat dissipation portion 238 of the heat transfer component 234. In this example, the cooling channel 252 comprises the component opening, a first channel portion 272 and a second channel portion 274. The first channel portion 272 is defined between the first opening 266 and the component opening 270 while the second channel portion 274 is defined between the second opening 268 and the component opening 270. In this example, the first channel portion 272 has a first size 276 (e.g., as measured along a direction that is substantially perpendicular to the first wall 256 and the second wall 260) that is substantially constant along the length of the first channel portion 272. The second channel portion 274 has a second size 278 (e.g., as measured along a direction that is substantially perpendicular to the first wall 256 and the second wall 260) that is substantially constant along the length of the second channel portion 274.

In an example, the first size 276 can be substantially equal to the second size 278. The first size 276 and the second size 278 may be less than a cross-sectional size (e.g., width) of the heat dissipation portion 238 of the heat transfer component 234. As such, the component opening 270 may be defined within the cooling channel 252 having a third size 280 that is greater than or substantially equal to the cross-sectional size (e.g., length) of the heat dissipation portion 238. The component opening 270 is therefore sized to receive the heat dissipation portion 238. In the illustrated example, the component opening 270 is positioned substantially at a midpoint of the cooling channel 252 between the first channel portion 272 and the second channel portion 274. The third size 280 may be greater than the first size 276 or the second size 278, such that the cooling channel 252 has a varying size across a length of the cooling channel 252 between the first opening 266 and the second opening 268.

In some examples, the electronics assembly 200 comprises a second circuit board assembly 282. In this example, the circuit board assembly 202 can border a first cooling side 284 of the cooling sub-assembly 250 while the second circuit board assembly 282 can border a second cooling side 286 of the cooling sub-assembly 250. The second circuit board assembly 282 is similar in some respects to the circuit board assembly 202, and may comprise a conductive portion, a dielectric portion, and a second heat transfer opening 288. The second circuit board assembly 282 may be electrically coupled to a second electronics component. A second heat transfer component can support the second electronics component, with a heat dissipation portion of the second heat transfer component extending through the second heat transfer opening 288 and into the cooling channel 252.

Figure 3:
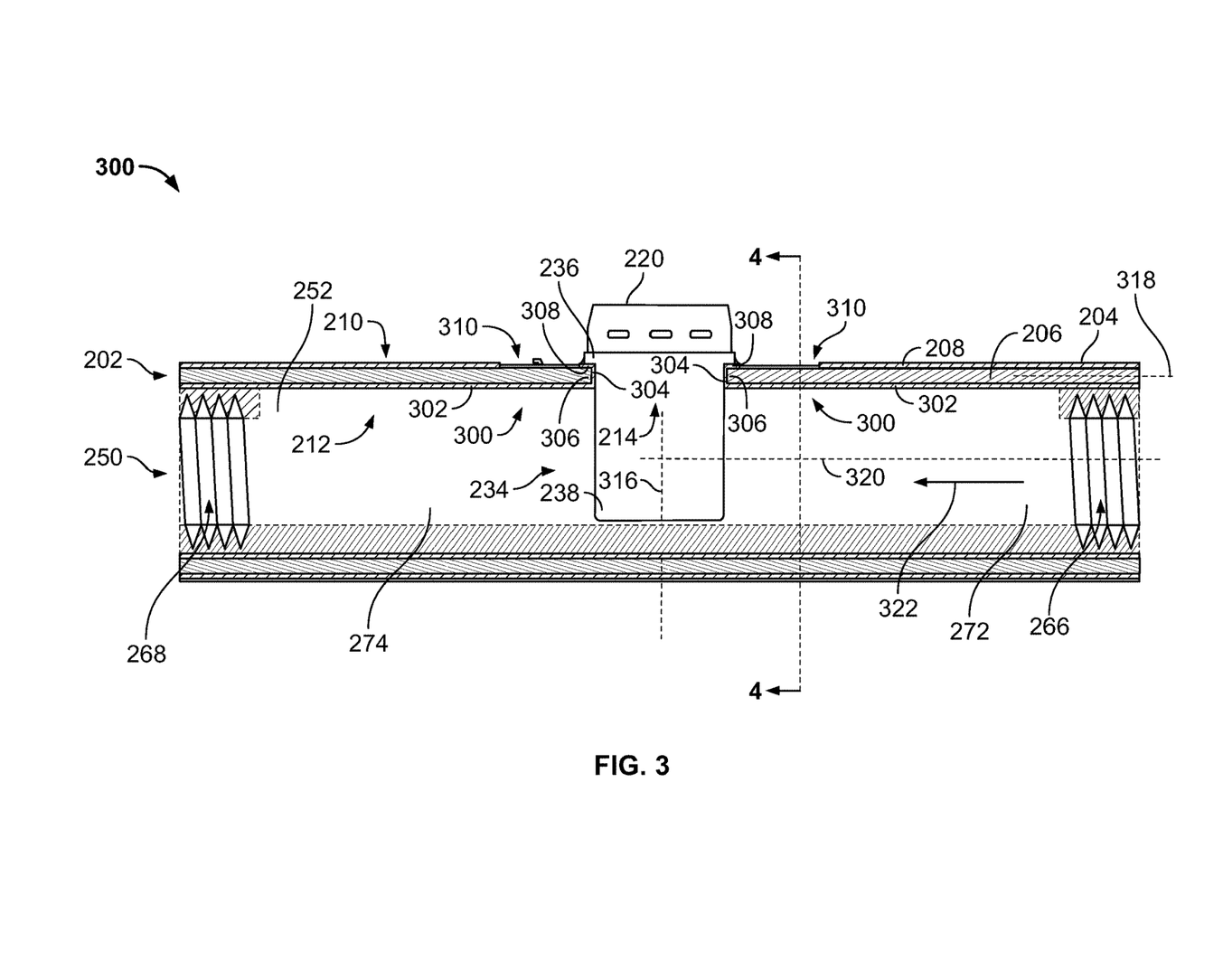
FIG. 3 illustrates a cross-sectional view of an example electronics assembly.

FIG. 3 illustrates a cross-sectional view (e.g., taken along line 3-3 in FIG. 2) of the electronics assembly 200. In an example, the circuit board assembly 202 comprises a conductive surface 300 that extends circumferentially around the heat transfer opening 214. The conductive surface 300 can comprise a conductive material, such as copper, silver, etc.

The conductive surface 300 comprises a first conductive portion 302, a second conductive portion 304, and a third conductive portion 308. The first conductive portion 302 can be disposed on a lower surface along the second side 212 of the dielectric portion 206 of the circuit board assembly 202. In some examples, the first conductive portion 302 can partially or completely cover the second side 212 of the dielectric portion 206.

The conductive surface 300 comprises a second conductive portion 304. In an example, the second conductive portion 304 can be disposed on a dielectric surface 306 of the dielectric portion 206, with the dielectric surface 306 defining the heat transfer opening 214 and extending between the first side 210 and the second side 212 of the dielectric portion 206. In the illustrated example, the dielectric surface 306 extends substantially perpendicularly with respect to an upper surface (e.g., at the first side 210) and a lower surface (e.g., at the second side 212) of the dielectric portion 206. In an example, the second conductive portion 304 can extend in a direction (e.g., up and down) that is substantially perpendicular to a direction along which the first conductive portion 302 extends. The second conductive portion 304 can extend around the heat transfer opening 214 to define a substantially continuous perimeter around the heat transfer opening 214.

The conductive surface 300 comprises a third conductive portion 308. In an example, the third conductive portion 308 can be disposed on an upper surface along the first side 210 of the dielectric portion 206 of the circuit board assembly 202. In some examples, the third conductive portion 308 can partially cover the first side 210 of the dielectric portion 206. For example, the third conductive portion 308 can terminate a distance from the conductive traces 208, such that a space 310 is defined between the third conductive portion 308 and the conductive traces 208. This space 310 can ensure that an electrical coupling is not made between the third conductive portion 308 of the conductive surface 300 and the conductive traces 208.

The heat transfer component 234 can be coupled with respect to the conductive surface 300. In some examples, by being coupled, the heat transfer component 234 and the conductive surface 300 can form a seal so as to limit fluid, such as the cooling fluid, from passing through the heat transfer opening 214 between the heat transfer component 234 and the conductive surface 300. In a possible example, the base portion 236 of the heat transfer component 234 can be coupled (e.g., soldered, joined, bonded, etc.) to the second conductive portion 304 and/or the third conductive portion 308 that extend circumferentially around the heat transfer opening 214. In addition or in the alternative, the heat dissipation portion 238 can be coupled (e.g., soldered, joined, bonded, etc.) to the first conductive portion 302, the second conductive portion 304, and/or the third conductive portion 308 of the conductive surface 300. As such, in these examples, when the heat transfer component 234 is coupled to the conductive surface 300, the cooling fluid is limited from passing through the heat transfer opening 214 between the heat transfer component 234 and the conductive surface 300 from the second side 212 to the first side 210 of the circuit board assembly 202.

The heat dissipation portion 238 of the heat transfer component 234 can extend along a first axis 316 when the heat transfer component 234 is coupled with respect to the conductive surface 300. In the illustrated example, the first axis 316 is substantially perpendicular to a plane 318 along which the circuit board assembly 202 extends. The heat dissipation portion 238 of the heat transfer component 234 can extend at least partially into the cooling channel 252. The cooling channel 252 can extend along a second axis 320 that intersects the first axis 316. In this example, the cooling fluid can flow (e.g., illustrated with arrowhead 322) through the cooling channel 252 along the second axis 320 in a direction that is substantially perpendicular to the first axis 316.

Figure 4:
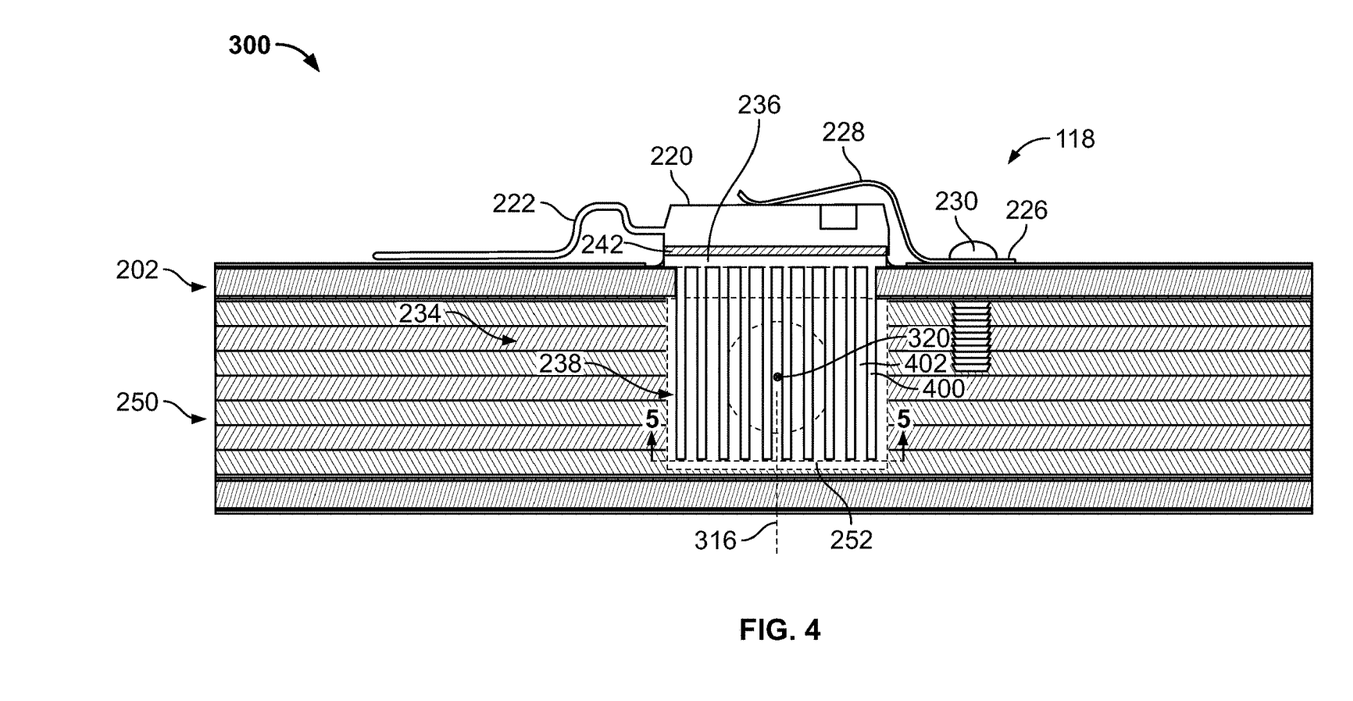
FIG. 4 illustrates a cross-sectional view of an example electronics assembly.

FIG. 4 illustrates a cross-sectional view (e.g., taken along line 4-4 in FIG. 3) of the electronics assembly 200. From the perspective illustrated in FIG. 4, the second axis 320, along which the cooling channel 252 extends, extends into and out of the page. As such, the cooling fluid can flow through the cooling channel 252 in a direction that is into and out of the page.

As the cooling fluid flows through the cooling channel 252, the cooling fluid can contact the heat dissipation portion 238 of the heat transfer component 234. In this example, the heat dissipation portion 238 comprises a plurality of fins 400 (or, as will be described below, pins). The fins 400 extend in a direction that is substantially parallel to the first axis 316. In this example, the fins 400 can define fin openings 402 between adjacent fins. In an example, the heat transfer component 234 can be arranged such that the fin openings 402 extend in a direction that is substantially parallel to a direction along which the cooling channel 252 extends along the second axis 320 (e.g., into and out of the page in FIG. 4). In the illustrated example, the fins 400 can extend in a direction that is substantially perpendicular to the base portion 236 of the heat transfer component 234 (e.g., up and down in FIG. 4). As the cooling fluid flows through the cooling channel 252, the cooling fluid can flow through the fin openings 402 between, and in contact with, the fins 400.

The heat dissipation portion 238 of the heat transfer component 234 and the cooling fluid can dissipate heat generated by the electronics component 220. For example, during operation, the electronics component 220 can generate heat. This heat can be dissipated from the electronics component 220, through the thermal interface 242, and to the heat transfer component 234. The base portion 236 of the heat transfer component 234 is in contact with the thermal interface 242. As such, the heat may be dissipated from the thermal interface 242, through the base portion 236, and to the heat dissipation portion 238. The heat can be conducted through the fins 400 of the heat dissipation portion 238 (e.g., downwardly in FIG. 4).

The cooling fluid can dissipate heat from the heat dissipation portion 238 by flowing through the fin openings 402. For example, the cooling fluid may be at a relatively lower temperature than the temperature of the fins 400. As the cooling fluid flows through the fin openings 402, the cooling fluid can contact the fins 400. This contact between the cooling fluid and the fins 400 can cause heat dissipation from the fins 400 to the cooling fluid, such as through convective heat transfer. The cooling fluid can move through the cooling channel 252 from the first opening 266 (e.g., illustrated in FIGS. 2 and 3) towards the second opening 268 (e.g., illustrated in FIGS. 2 and 3), allowing for the dissipated heat to be drawn from the fins 400 towards the second opening 268.

Figure 5:
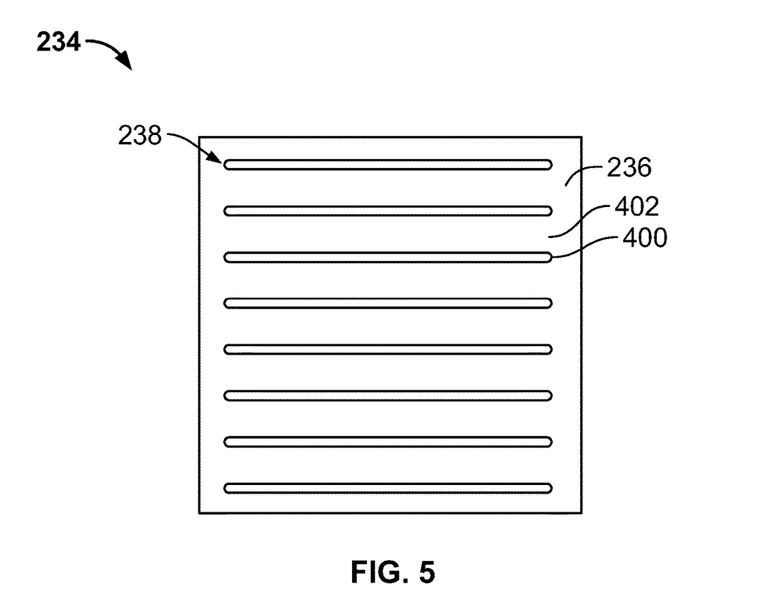
FIG. 5 illustrates a cross-sectional view of an example heat transfer component for use in an example electronics assembly.

Turning to FIG. 5, an example of the heat transfer component 234 (e.g., taken along line 5-5 in FIG. 4) is illustrated. In this example, the heat transfer component 234 comprises the base portion 236, and the heat dissipation portion 238. The fins 400 of the heat dissipation portion 238 project from the base portion 236, with the fin openings 402 extending between adjacent fins 400. Heat can be conducted from the base portion 236 to the fins 400. The cooling fluid can flow through the fin openings 402, thus drawing the heat from the fins 400 by means of convection.

Figure 6:
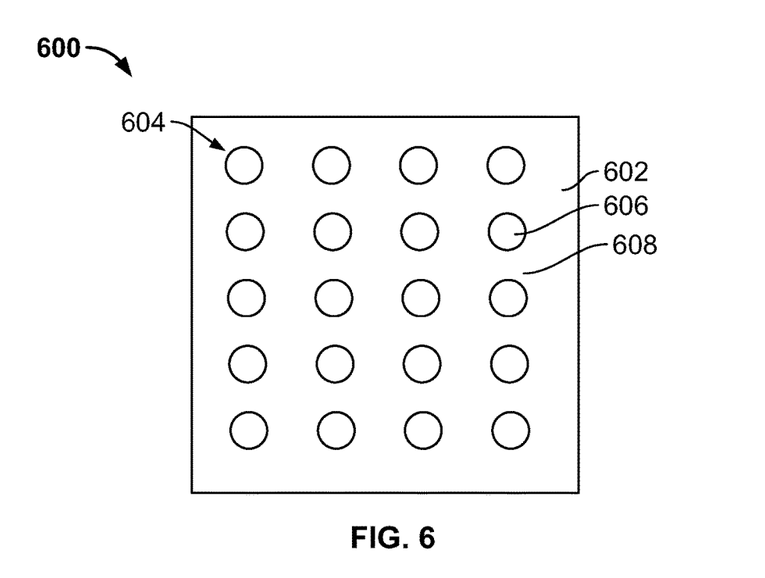
FIG. 6 illustrates a cross-sectional view of an example heat transfer component for use in an example electronics assembly.

Turning to FIG. 6, a second example of a heat transfer component 600 is illustrated. The heat transfer component 600 can be incorporated as part of the electronics assembly 200 and can be coupled to the electronics component 220 and to the circuit board assembly 202. The heat transfer component 600 can comprise a base portion 602 and a heat dissipation portion 604 that extends from the base portion 602. The base portion 602 can be sealed with respect to the circuit board assembly 202 in a similar manner as described with respect to FIG. 3. The heat dissipation portion 604 can extend through the heat transfer opening 214 of the circuit board assembly 202.

In this example, the heat dissipation portion 604 comprises a plurality of pins 606. The pins 606 can be arranged in a matrix configuration with one or more rows of pins and one or more columns of pins. The pins 606 can be spaced apart from each other along the one or more rows and along the one or more columns. The pins 606 can be coupled to the base portion 602, such that the pins 606 extend in a direction away from the base portion 602. The pins 606 can be spaced apart from each other to define pin openings 608 between adjacent pins.

The heat transfer component 600 can dissipate heat in a similar manner as the heat transfer component 234. For example, the heat dissipation portion 604 of the heat transfer component 600 can extend at least partially into the cooling channel 252. The cooling fluid can dissipate heat from the heat dissipation portion 604 by flowing through the pin openings 608. For example, as the cooling fluid flows through the pin openings 608, the cooling fluid can contact the pins 606. This contact between the cooling fluid and the pins 606 can cause heat dissipation from the pins 606 to the cooling fluid, such as through convective heat transfer. The cooling fluid can move through the cooling channel 252 from the first opening 266 (e.g., illustrated in FIGS. 2 and 3) towards the second opening 268 (e.g., illustrated in FIGS. 2 and 3), allowing for the dissipated heat to be drawn from the pins 606 towards the second opening 268.

By providing the electronics assembly 200 with the heat transfer component 234, 600 and the cooling sub-assembly 252, heat generated by the electronics component 220 can be dissipated more effectively. Cooling fluid can flow through openings 402, 608 within the heat dissipation portion 238, 604 of the heat transfer component 234, 600, thus removing heat from the electronics assembly 200. In addition, the cooling sub-assembly 252 is relatively easy and inexpensive to manufacture. For example, the first opening 266, the second opening 268, and the cooling channel 252 can be machined into the cooling sub-assembly 252 without the need for additional components, such as tubes, conduits, pipes, etc. Other methods of manufacturing the cooling channel 252 may comprise, for example, forming one or more openings through the cooling sub-assembly 250, and then inserting a hollow structure (e.g., a pipe, tube, cylinder, etc.) into the formed openings(s). The hollow structure can be affixed to the cooling sub-assembly 250 by knurling the hollow structure and coupling the hollow structure to the cooling sub-assembly 250 with an epoxy.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated given the benefit of this description. Further, it will be understood that not all operations are necessarily present in each embodiment provided herein. Also, it will be understood that not all operations are necessary in some embodiments.

The words "example" and/or "exemplary" are used herein to mean serving as an example, instance, or illustration. Any aspect, design, etc. described herein as "example" and/or "exemplary" is not necessarily to be construed as advantageous over other aspects, designs, etc. Rather, use of these terms is intended to present concepts in a concrete fashion. As used in this application, the term "or" is intended to mean an inclusive "or" rather than an exclusive "or." In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes, " "having," "has," "with," or variants thereof are used, such terms are intended to be inclusive in a manner similar to the term "comprising."

As used in this application, the terms "component," "module," "system," "interface," and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Further, unless specified otherwise, "first," "second," and/or the like are not intended to imply a temporal aspect, a spatial aspect, an ordering, etc. Rather, such terms are merely used as identifiers, names, etc. for features, elements, items, etc. (e.g., "a first channel and a second channel" generally corresponds to "channel A and channel B" or two different (or identical) channels or the same channel). Although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. An electronics assembly within an imaging system, the electronics assembly comprising:
    a circuit board assembly through which a signal is configured to be delivered, wherein:
        the circuit board assembly defines a heat transfer opening between a first side and a second side, and
        the circuit board assembly comprises a dielectric portion and a conductive element;
    an electronics component electrically coupled to the first side of the circuit board assembly;
    a heat transfer component supporting the electronics component, the heat transfer component comprising:
        a base portion coupled to the electronics component and to the circuit board assembly, wherein the base portion contacts the conductive element; and
        a heat dissipation portion extending through the heat transfer opening of the circuit board assembly, the heat dissipation portion configured to dissipate heat generated by the electronics component; and
    a thermal interface disposed between the electronics component and the base portion of the heat transfer component, the thermal interface configured to transmit heat generated by the electronics component to the heat transfer component.

2. The electronics assembly of claim 1, wherein the heat dissipation portion comprises a plurality of fins.

3. The electronics assembly of claim 1, wherein the heat dissipation portion comprises a plurality of pins.

4. The electronics assembly of claim 1, wherein the base portion is sealed with respect to the circuit board assembly.

5. An electronics assembly within an imaging system, the electronics assembly comprising:
    a circuit board assembly through which a signal is configured to be delivered, wherein:
        the circuit board assembly defines a heat transfer opening between a first side and a second side,
        the circuit board assembly comprises a dielectric portion and a conductive element that extends circumferentially around the heat transfer opening, and
        the circuit board assembly comprises one or more conductive traces electrically coupled to an electronics component and spaced apart from the conductive element;
    an electronics component electrically coupled to the first side of the circuit board assembly; and
    a heat transfer component supporting the electronics component, the heat transfer component comprising:
        a base portion coupled to the electronics component and to the circuit board assembly, wherein the base portion contacts the conductive element, wherein the base portion is sealed with respect to the circuit board assembly; and
        a heat dissipation portion extending through the heat transfer opening of the circuit board assembly, the heat dissipation portion configured to dissipate heat generated by the electronics component.

6. An electronics assembly within an imaging system, the electronics assembly comprising:
    a circuit board assembly through which a signal is configured to be delivered, the circuit board assembly defining a heat transfer opening between a first side and a second side;
    an electronics component electrically coupled to the first side of the circuit board assembly;
    a heat transfer component supporting the electronics component, the heat transfer component comprising:
        a base portion coupled to the electronics component and to the circuit board assembly; and
        a heat dissipation portion extending through the heat transfer opening of the circuit board assembly; and
    a cooling sub-assembly coupled to the second side of the circuit board assembly, the cooling sub-assembly defining a cooling channel extending adjacent to the heat transfer opening of the circuit board assembly such that the heat dissipation portion extends into the cooling channel, wherein the cooling sub-assembly is configured such that a cooling fluid can flow through the cooling channel in contact with the heat dissipation portion of the heat transfer component such that the heat dissipation portion of the heat transfer component and the cooling fluid can dissipate heat generated by the electronics component.

7. The electronics assembly of claim 6, further comprising a thermal interface disposed between the electronics component and the base portion of the heat transfer component, the thermal interface configured to transmit heat generated by the electronics component to the heat transfer component.

8. The electronics assembly of claim 6, wherein the base portion is sealed with respect to the circuit board assembly.

9. The electronics assembly of claim 8, wherein the circuit board assembly comprises a conductive surface extending circumferentially around the heat transfer opening, the base portion configured to be coupled with respect to the conductive surface.

10. The electronics assembly of claim 6, wherein the cooling sub-assembly defines a first opening and a second opening in fluid communication with the cooling channel such that the cooling fluid can enter the cooling channel through the first opening and exit the cooling channel through the second opening.

11. The electronics assembly of claim 6, wherein the heat dissipation portion of the electronics component extends along a first axis that is substantially perpendicular to a plane along which the circuit board assembly extends, the cooling channel extending along a second axis that intersects the first axis.

12. The electronics assembly of claim 11, wherein the cooling sub-assembly is configured such that the cooling fluid can flow through the cooling channel in a direction that is substantially perpendicular to the first axis.

13. The electronics assembly of claim 6, wherein the cooling channel is bounded on a first side by a first wall of the cooling sub-assembly and on a second side by a second wall of the cooling sub-assembly, the cooling channel unbounded along a third side that is adjacent to the second side of the circuit board assembly.

14. A magnetic resonance imaging (MRI) system comprising:
a housing defining an examination region;
a coil supported within the housing and configured to generate a magnetic field within the examination region; and
a power electronics assembly for delivering power to the coil, the power electronics assembly comprising:
a circuit board assembly through which power is configured to be delivered, the circuit board assembly defining a heat transfer opening between a first side and a second side;
an electronics component electrically coupled to the first side of the circuit board assembly;
a heat transfer component supporting the electronics component, the heat transfer component comprising:
a base portion coupled to the electronics component and to the circuit board assembly; and
a heat dissipation portion extending through the heat transfer opening of the circuit board assembly; and
a cooling sub-assembly coupled to the second side of the circuit board assembly, the cooling sub-assembly defining a cooling channel extending adjacent to the heat transfer opening of the circuit board assembly such that the heat dissipation portion extends into the cooling channel, wherein the cooling sub-assembly is configured such that a cooling fluid can flow through the cooling channel in contact with the heat dissipation portion of the heat transfer component such that the heat dissipation portion of the heat transfer component and the cooling fluid can dissipate heat generated by the electronics component.

15. The MM system of claim 14, wherein the cooling sub-assembly defines a first opening and a second opening in fluid communication with the cooling channel such that the cooling fluid can enter the cooling channel through the first opening and exit the cooling channel through the second opening.

16. The MM system of claim 14, wherein the cooling channel is bounded on a first side by a first wall of the cooling sub-assembly and on a second side by a second wall of the cooling sub-assembly, the cooling channel unbounded along a third side that is adjacent to the second side of the circuit board assembly.

17. The MM system of claim 14, wherein the heat dissipation portion extends along a first axis that is substantially perpendicular to a plane along which the circuit board assembly extends, the cooling channel extending along a second axis that intersects the first axis.

18. The MM system of claim 14, wherein the circuit board assembly comprises a conductive surface extending circumferentially around the heat transfer opening, the base portion configured to be coupled with respect to the conductive surface.

19. The MM system of claim 14, wherein the base portion is sealed with respect to the circuit board assembly.

* * * * *

UNITED STATES PATENT AND TRADEMARK OFFICE
CERTIFICATE OF CORRECTION

PATENT NO. : 10,237,967 B2
APPLICATION NO. : 14/873599
DATED : March 19, 2019
INVENTOR(S) : Richard A. Maillet, Jr. et al.

It is certified that error appears in the above-identified patent and that said Letters Patent is hereby corrected as shown below:

In the Specification
| | | |
|---|---|---|
| Columns 12, 13, | Lines 67, 1, | change "extent that "includes, " " "having,"" to --extent that "includes," "having,"-- |

In the Claims

| | | | |
|---|---|---|---|
| Claim 15, | Column 16, | Line 25, | change "The MM system" to --The MRI system-- |
| Claim 16, | Column 16, | Line 30, | change "The MM system" to --The MRI system-- |
| Claim 17, | Column 16, | Line 35, | change "The MM system" to --The MRI system-- |
| Claim 18, | Column 16, | Line 40, | change "The MM system" to --The MRI system-- |
| Claim 19, | Column 16, | Line 45, | change "The MM system" to --The MRI system-- |

Signed and Sealed this
Thirtieth Day of April, 2019

Andrei Iancu
*Director of the United States Patent and Trademark Office*